US008917963B2

(12) United States Patent
Pezeshki et al.

(10) Patent No.: US 8,917,963 B2
(45) Date of Patent: Dec. 23, 2014

(54) MEMS-BASED LEVERS AND THEIR USE FOR ALIGNMENT OF OPTICAL ELEMENTS

(75) Inventors: Bardia Pezeshki, Newark, CA (US); Michael Sherback, Newark, CA (US); Dinh Ton, Newark, CA (US)

(73) Assignee: Kaiam Corp., Newark, CA (US)

( * ) Notice: Subject to any disclaimer, the term of this patent is extended or adjusted under 35 U.S.C. 154(b) by 696 days.

(21) Appl. No.: 13/113,994

(22) Filed: May 23, 2011

(65) Prior Publication Data

US 2012/0195551 A1    Aug. 2, 2012

Related U.S. Application Data

(60) Provisional application No. 61/347,247, filed on May 21, 2010.

(51) Int. Cl.
| | |
|---|---|
| *G02B 6/26* | (2006.01) |
| *G02B 6/32* | (2006.01) |
| *G02B 26/08* | (2006.01) |
| *G02B 6/42* | (2006.01) |

(52) U.S. Cl.
CPC .......... *G02B 26/0875* (2013.01); *G02B 6/4204* (2013.01)
USPC ........................................................ 385/52

(58) Field of Classification Search
CPC .......... G02B 6/366; G02B 6/351; G02B 6/32; G02B 6/4226
USPC .................................. 359/812, 813
See application file for complete search history.

(56) References Cited

U.S. PATENT DOCUMENTS

| | | | |
|---|---|---|---|
| 4,691,586 A * | 9/1987 | van Leijenhorst et al. | 74/490.09 |
| 4,773,727 A * | 9/1988 | Le Pivert et al. | 385/134 |
| 5,351,330 A * | 9/1994 | Jongewaard | 385/93 |
| 5,550,088 A | 8/1996 | Dautartas et al. | |
| 6,222,967 B1 | 4/2001 | Amano et al. | |
| 6,275,344 B1 * | 8/2001 | Holderer | 359/822 |
| 6,346,710 B1 * | 2/2002 | Ue | 250/442.11 |
| 6,556,364 B2 * | 4/2003 | Meehan et al. | 359/822 |
| 7,193,794 B2 * | 3/2007 | Beck et al. | 359/822 |
| 7,239,107 B1 * | 7/2007 | Ferreira et al. | 318/649 |
| 7,667,905 B2 * | 2/2010 | Eromaki | 359/817 |

(Continued)

FOREIGN PATENT DOCUMENTS

| | | |
|---|---|---|
| DE | 10010392 A1 * | 11/2000 |
| JP | 07-168044 | 7/1995 |
| KR | 10-1999-0079489 | 11/1999 |
| KR | 10-2003-0065908 | 8/2003 |

OTHER PUBLICATIONS

International Search Report on corresponding PCT application (PCT/US2011/037621) from International Searching Authority (KIPO) dated Jan. 10, 2012.

(Continued)

*Primary Examiner* — Michelle R Connelly
(74) *Attorney, Agent, or Firm* — Klein, O'Neill & Singh, LLP (57) ABSTRACT

A MEMS based alignment technology based on mounting an optical component on a released micromechanical lever configuration that uses multiple flexures rather than a single spring. The optical component may be a lens. The use of multiple flexures may reduce coupling between lens rotation and lens translation, and reduce effects of lever handle warping on lens position. The device can be optimized for various geometries.

9 Claims, 8 Drawing Sheets

(56) References Cited

U.S. PATENT DOCUMENTS

| | | | |
|---|---|---|---|
| 2002/0136485 A1* | 9/2002 | Reed et al. | 385/18 |
| 2004/0184709 A1* | 9/2004 | Kubby et al. | 385/16 |
| 2004/0223721 A1* | 11/2004 | Flanders et al. | 385/147 |
| 2005/0269898 A1* | 12/2005 | Miller et al. | 310/309 |

OTHER PUBLICATIONS

Written Opinion on corresponding PCT application (PCT/US2011/037621) from International Searching Authority (KIPO) dated Jan. 10, 2012.

* cited by examiner

MEMS-BASED LEVERS AND THEIR USE FOR ALIGNMENT OF OPTICAL ELEMENTS

CROSS REFERENCE TO RELATED APPLICATIONS

This application claims the benefit of the filing date of U.S. Provisional Application No. 61/347,247, filed May 21, 2010, entitled "MEMS-Based Levers and Their Use for Alignment of Optical Elements," the disclosure of which is incorporated by reference.

BACKGROUND OF THE INVENTION

The present application relates to the field of fiber optic communication and, more particularly, to optical packaging techniques used to optically couple laser sources to optical fibers or other waveguides.

Optical modules that are used for long haul and metropolitan fiber optic telecommunication links, such as lasers, modulators, splitters, add/drop multiplexers and receivers generally contain many small components such as mirrors, beamsplitters, detectors, and other precision components that have to be carefully aligned and attached in place to achieve optical coupling. Such fiber optic links use single mode fiber that has a mode size of a few microns. Thus precision alignment is required for all these components, adding greatly to the cost of such modules and lowering the manufacturing yield.

U.S. patent application Ser. No. 12/698,086, filed Feb. 1, 2010, the disclosure of which is incorporated by reference herein, discusses a packaging technology that allows precise positioning of optical components using a MEMS-based platform. The optical coupling between the active element such as a laser and the PLC waveguide was done by precise alignment of a microlens that is mounted on an adjustable holder that forms a lever with an anchor point and a handle. Moving the handle causes the microlens to move some small fraction of the distance traveled by the handle. Thus alignment is considerably eased.

BRIEF SUMMARY OF THE INVENTION

In one aspect the invention provides a mechanism for positioning an optical component, comprising: a first flexure coupled to a base; a structure coupled to the first flexure, the structure generally in the form of a quadrilateral, the structure including a first pair of the pairs of flexures having a first direction of orientation and a second pair of the pairs of flexures having a second direction of orientation, the structure including a mount for an optical component; and an elongate arm extending generally from the structure.

In another aspect the invention provides a device for use in an optical assembly, comprising: a multi-part lever structure coupled to a substrate by a base, the multi-part lever structure including a first flexure coupled to the base, an elongate arm, and at least a second flexure and a first member coupling the elongate arm to the first flexure; and a lens coupled to the multi-part lever structure.

In another aspect the invention provides a structure for use in optically aligning two optical components, comprising: an elongate arm; a first flexure extending from the elongate arm in a first direction; a second flexure extending from the elongate arm in a second direction, the second direction being different than the first direction; a first member extending from the first flexure, with a mount for an optical component coupled to the first member; a second member extending from the second flexure; a third flexure, a third member, and a fourth flexure coupling the second member and the first member; and a fifth flexure coupling the second member to a base.

In another aspect the invention provides a device for use in aligning optical components, comprising: a platform for receiving an optical component; a first flexure element coupling the platform to a base; an arm coupled to the platform, the arm including a second flexure element, the arm including a free end.

In another aspect the invention provides a device for use in aligning optical components, comprising: a platform for receiving an optical component; means for flexibly coupling the platform to a base; and an elongate arm coupled to the platform.

These and other aspects of the invention are more fully comprehended considering the discussion herein.

BRIEF DESCRIPTION OF THE DRAWINGS

The present patent is illustrated by way of examples.

DETAILED DESCRIPTION

Aspects of the invention provide an arrangement for actuating the position of an optical component using MEMS-based levers and handles in such as way as not to interfere with the placement of other optical or electrical elements close to the adjustable component. In some aspects the position of the component can be adjusted precisely in all three axes, and with significant leverage (or reduction in movement) in the axes perpendicular to the optical axis. This allows coarse motions at the handle to be mechanically demagnified at the position of the lens or other optical component.

Figure 1:
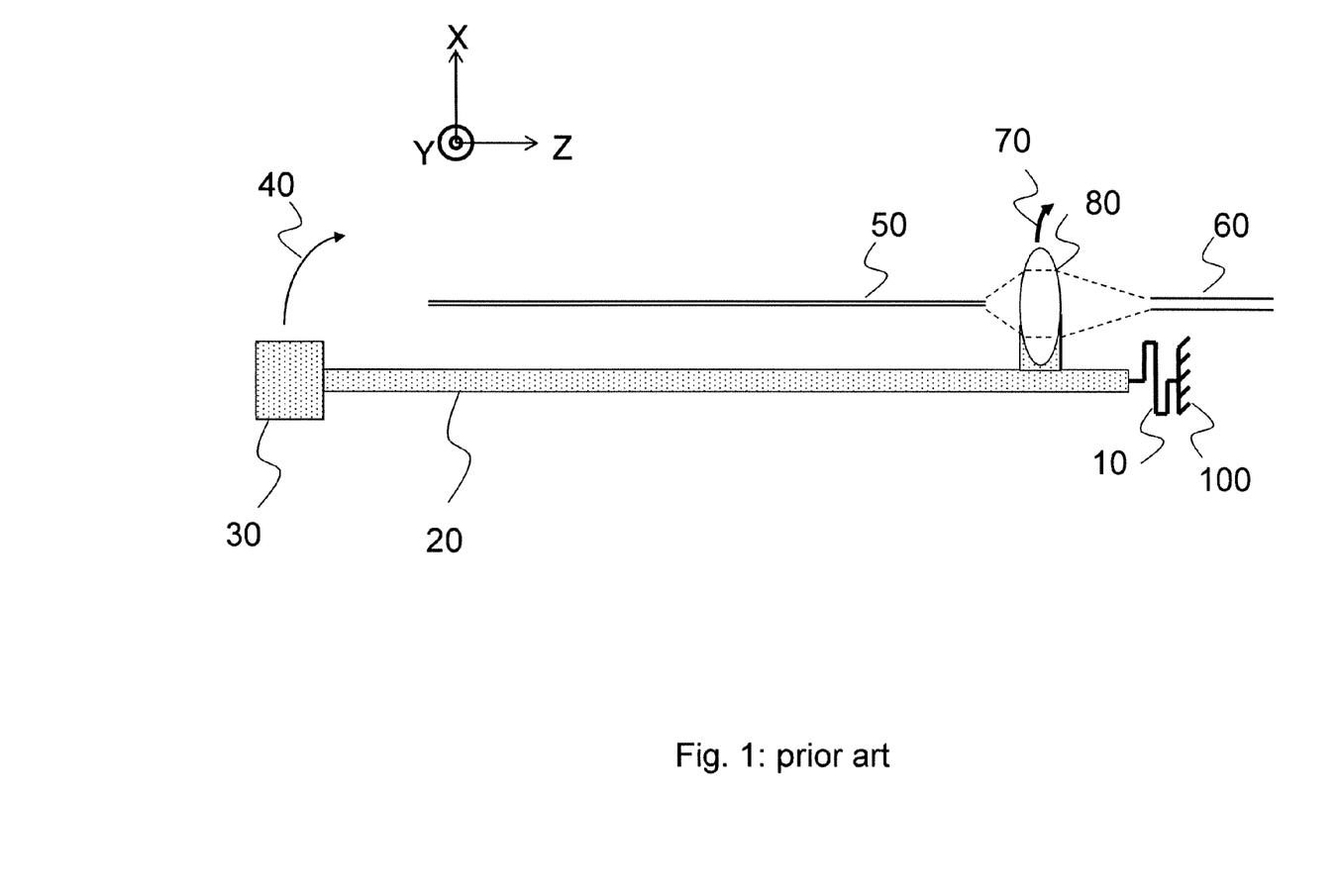
FIG. 1 (prior art) illustrates the use of a simple lever to precisely position a lens with respect to an input and output waveguide.

FIG. 1 shows a microlens 80 used to couple light from a tight input waveguide guide, such as that of a laser diode, to a larger output waveguide 60, such as that of a standard optical fiber. By positioning the lens closer to the laser output than the fiber input, the lens transforms the mode to the proper size. Usually, the tolerances on this lens are very tight, and the lens preferably is positioned and controlled with sub-micron accuracy. Once the alignment is realized, it preferably is locked into place with epoxy or solder in such a manner than any shifts are minimized. This may be challenging and may either require capital intensive automated tools or well trained operators making the adjustment manually. To reduce the accuracy required in mounting the lens, U.S. patent application Ser. No. 12/698,086 discusses mounting the lens on a lever 20 that is anchored to a stable part of the assembly 100 using a spring 10. This spring can be flexed laterally and squeezed or stretched longitudinally. To adjust the x position of the lens, the handle at the end of the lever 30 is moved in the x direction 40. This causes the entire lever 20 to rotate about the anchor point 100 and moves the lens 80 in the x direction 70, but the amount of movement is reduced by the ratio of the distance between the lens and the anchor point to the distance between the lens and the handle. A similar motion out of the plane adjusts the position of the lens in y with similar magnification. However an adjustment in z, or the optical axis is realized by squeezing or stretching the spring longitudinally that offers no reduction in motion. This is not critical in this case as the dependence on the optical loss on the z position of the lens is far less than its dependence on the x and y axes.

As described in U.S. patent application Ser. No. 12/698,086, to fabricate such a MEMS based lever, fairly standard processes can be used. An SOI silicon wafer is patterned from the top to define the lever and the lens holder. The oxide underneath is etched away to suspend the lever. The lens is mounted on the lever using solder or epoxy. Once the part has been aligned, the lever is locked down close to the position of the handle.

FIG. 2 is a drawing of an embodiment in accordance with aspects of the present invention, where one desires to move a lens 80 using a handle 210 about a stable anchor 100. FIG. 2a is a top view of the structure with no forces or deflection. The structure is fabricated with a process similar to or the same as that described previously in that all the parts are released and are free to move with the exception of the anchor 100. This part is connected to the rest of the wafer and therefore is stable. The structure generally has an L-shaped form, with the main member 20, shown as an elongate arm with a handle 210 at a free end, connected to a horizontal member 260 by a flexure 230a, with the main lever and horizontal lever as illustrated orthogonal to one another. This horizontal member is connected to the anchor with a relatively stiff flexure 220 that can bend and twist. The lens 80 is mounted between these two members using a combination of flexures (230a,b, 240a,b) and stiff cantilevers (270a,b). In some embodiments, and as illustrated in FIGS. 2a-d, the flexures 230a,b are orientated in the same direction, and the flexures 240a,b are also orientated in the same direction, with the orientations of flexures 230a,b orthogonal to the orientation of the flexures 240a,b.

Figure 2A:
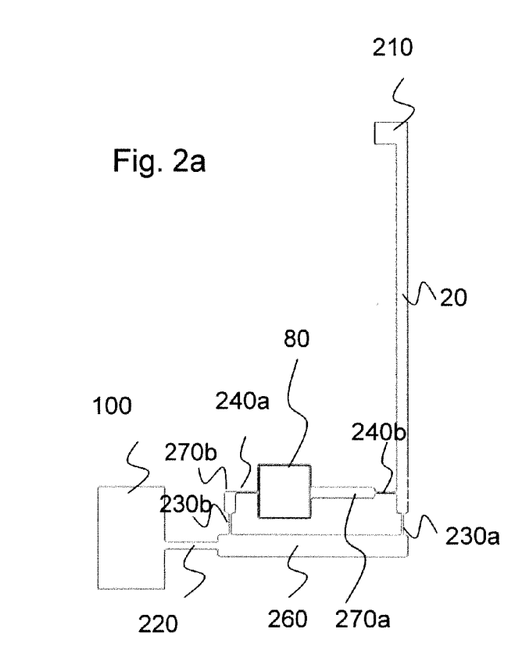
FIGS. 2a-d illustrate aspects of a structure in accordance with aspects of the invention.
Figure 2B:
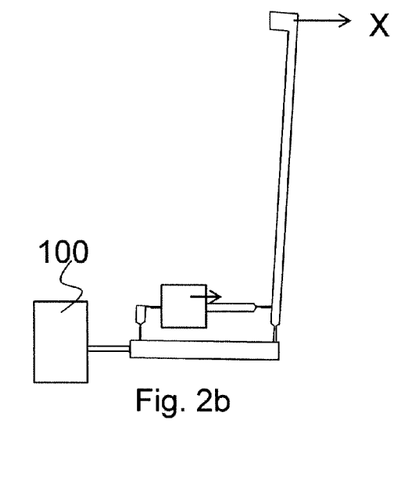

When the lever is moved in the X direction, as shown in FIG. 2b, flexure 220 does not move much owing to its stiffness compared to the other flexures. Therefore most of the deflection occurs in flexures 230a,b and 240a,b. In some embodiments the flexures 240a and 240b have matching characteristics, provided in some embodiments by the flexures having the same physical structure. Similarly, in some embodiments the flexures 230a and 230b having matching characteristics. The lens moves in X a fraction of the distance of the handle, the fraction being given approximately by the ratio of the length between the connection point of flexure 240b on the handle 20 to lower member 260 and the total length of the handle.

Figure 2C:
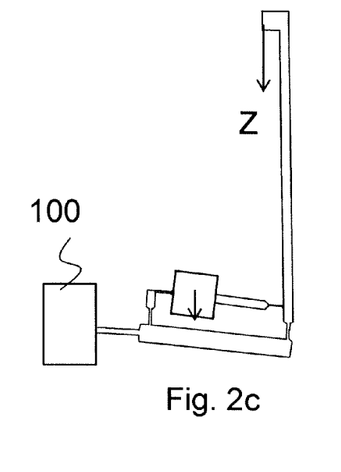

When the lever is moved in Z, as shown in FIG. 2c, the flexures do not easily shrink or expand, so that significant bending movement about the Y axis appears on the stiff flexure 220. This causes deflection of the flexures such that the lens moves down in Z. The lens moves a fraction of the distance that the handle moves in Z, the ratio being roughly equal to the ratio of the distance between the lens and the anchor point to the total length of the lower member 260.

Figure 2D:
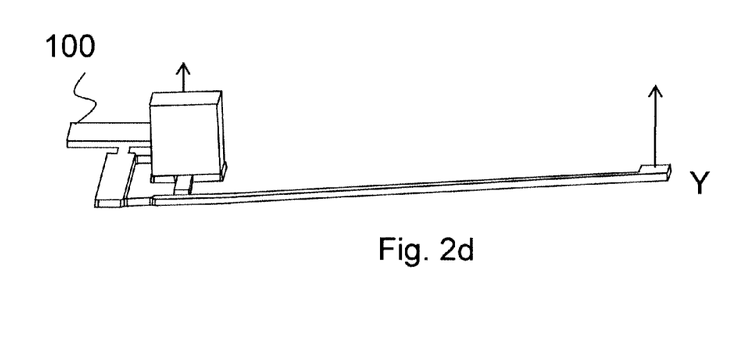

Finally, when the handle is moved in Y, or out of the plane in FIG. 2a, the entire structure twists flexure 220 about the X axis and causes the lens to move up along the Y axis. A side view is shown in FIG. 2d. Once again the motion is demagnified roughly by the ratio of the z separation between the lens and the anchor point to the total length of the handle 20.

Compared to the simple case of FIG. 1, the embodiment of FIGS. 2a-d has a number of potential advantages. First, the rotation of the lens accompanying motion of the handle along the X axis is reduced. Second, unlike a spring that is generally much easier to deflect laterally than compressed or expanded longitudinally, the present structure has somewhat similar forces for deflection in all three axes. Third, the arrangement of flexures makes for a stiffer structure and higher resonance frequencies that translates to less sensitivity to shock and vibration. Fourth, the lever and the handle are somewhat out of the way and can be positioned on the outside of the overall structure, rather than in a straight line. This allows other components to be placed close to the lens. Finally, the structure is relatively insensitive to torsional moments in the lever arm, providing for increased efficiency since locking the handle 220 with solder or epoxy can sometimes result in torques about the handle 220 that can act along the long arm 20 and cause the lens to translate.

Figure 3:
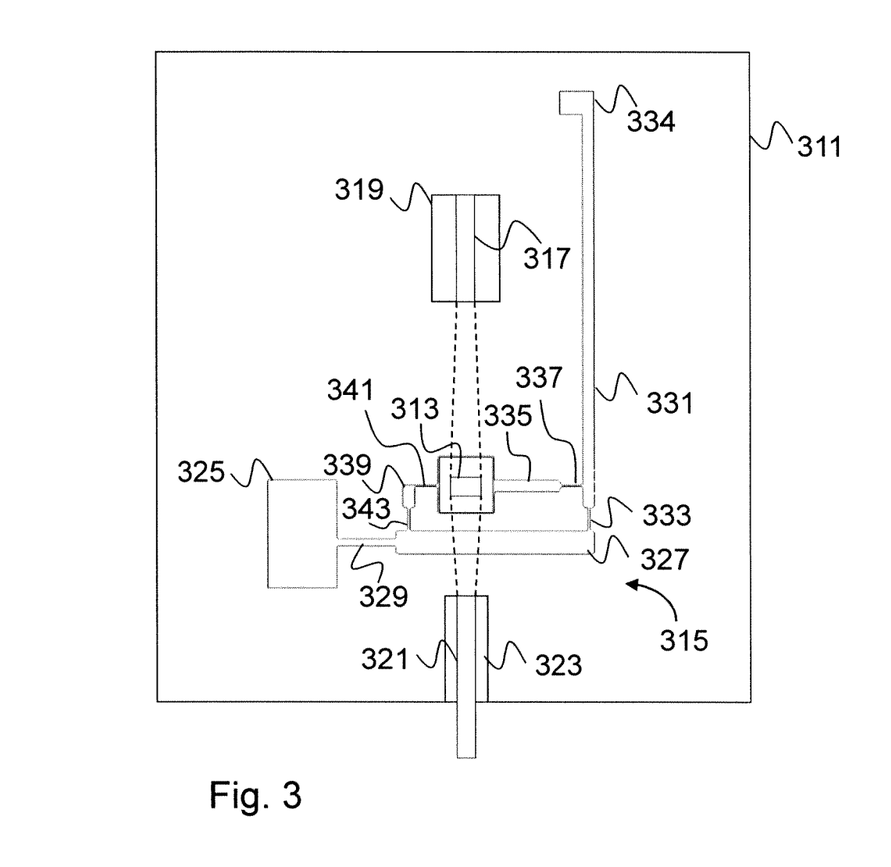
FIG. 3 illustrates an embodiment in accordance with aspects of the invention.

FIG. 3 is a top view of a device, or portions of a device, in accordance with aspects of the invention. In FIG. 3, various components are shown generally over a substrate 311, with, in many embodiments, some of the components formed of the same material as and integral with the substrate. More particularly, FIG. 3 shows a lens 313 coupled to a multi-part lever structure 315. The lens is positionable to focus light from a first waveguide, shown as a laser 317 of a laser chip 319 mounted to the substrate. The lens focuses the light into a second waveguide, shown as a fiber pigtail 321, with the fiber pigtail held by a mount 323.

The multi-part lever structure is coupled to the substrate by a base 325. The multi-part lever structure includes a base flexure 329 coupled to the base, an end member 331 with a handle 334 at one end, and a quadrilateral structure between the first flexure and the end member. As illustrated in FIG. 3, a portion of the end member opposite the handle also forms part of the quadrilateral structure.

The quadrilateral structure may be in the form of a parallelogram, as for example illustrated in FIG. 3. As shown in FIG. 3 the quadrilateral structure includes a base member 327, a mount member 335, a first side member 339, and a portion of the end member. The base member is coupled to the base by the base flexure and coupled to the end member, at an end opposite the handle, by a first flexure 333. The base member is also coupled to the first side member by a second flexure 343. Generally opposing the base member is the mount member, with the mount member coupled to the end member by a third flexure 337. As illustrated, the mount member includes a mount for receiving the lens, although in various embodiments the mount is on a different member.

In a normally biased position, the first flexure and the second flexure are roughly parallel to one another, and roughly in the same plane as and orthogonal to the third and fourth flexures, which are also roughly parallel to one another. In operation, displacement of the handle in directions parallel to the third and fourth flexures results in bending of the first and second flexures, and change in position of the lens in direction of displacement of the handle.

Figure 4:
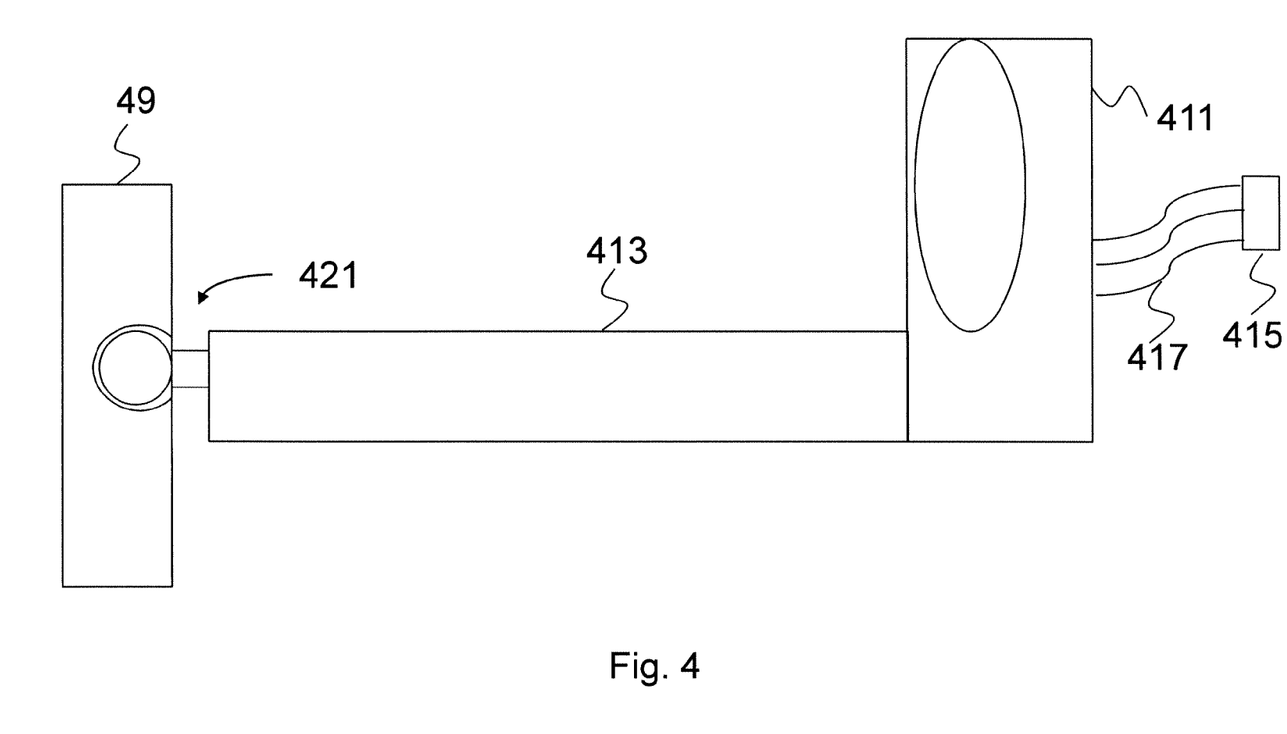
FIG. 4 illustrates a further embodiment of a structure in accordance with aspects of the invention.

FIG. 4 is a drawing of a device, which in some ways may be considered an ideal device, in which multiple joints are used to reduce the effects of warping or rotation at the handle on the lens location. The device of FIG. 4 has a lens platform 411 with an extending lever arm 413. The lens platform is coupled to a fixed base 415 by a platform flexure group 417. Preferably the platform flexure group provides 2 rotational degrees of freedom and 1 translational degree of freedom, for example by way of use of a Rzeppa joint and spline. An end of the lever away from the platform is coupled to a handle by a ball and socket 421, preferably providing 3 rotational degrees of freedom. The attenuating effects of leverage on translational motion by the design embodiment in U.S. patent application Ser. No. 12/698,086 and the embodiments in FIGS. 2 and 3 have been discussed, but consideration is now given to certain issues involving rotation of the handle, or to apparent rotation of the handle due to warping. The handle may be warped or rotated, for example, by mismatches in thermal coefficients of expansion between the parts and any solder, epoxy, or other joining material. The present embodiment in FIG. 4 eliminates the effect of rotating the handle. The principle advantage of such an arrangement becomes evident when any embodiment has a lens center offset in Y from the flexures or joints. Such an offset causes rotation of the lens platform to move the lens along X, which is generally undesirable. Therefore the multiple-joint mechanism shown in FIG. 4 is useful if significant handle rotation is expected.

The device in FIG. 4 is not particularly suited to MEMS manufacturing, however. Some embodiments incorporate a torsionally compliant flexure or flexure group within the lever arm or handle that replace the ball and socket joint 421 of the ideal case, in addition to a flexure group between, or including, the lens platform and the base structure. In particular, in some embodiments a flexure or flexure group is incorporated into the lever arm, with the flexure group having stiffness in three translational and two rotational degrees of freedom, and substantial compliance in torsion about approximately the Z axis, with these axes as discussed with respect to FIGS. 2a-d. Thus, for example, some embodiments of the devices of FIGS. 2 and 3 include a flexure or flexure group in the lever arm. Preferably, the resistance of the lens platform flexure group to rotation about the Z axis is greater than that of the lever arm flexure group. Additional rotational compliance in other degrees of freedom may be incorporated into the lever arm flexure group, if desired.

The relative significance of handle rotation and warping about the different axes may vary depending on embodiments, but incorporation of compliance into the lever arm with a flexure group while having relative stiffness in the corresponding degree of freedom in the lens platform flexure group may be commonly applied to embodiments specifically discussed herein as well as additional embodiments. Many embodiments having a property of handle rotation insensitivity are possible depending on design goals involving sensitivity to various handle rotations, geometric constraints, process constraints, required range of motion, available space, and other considerations.

Figure 5:
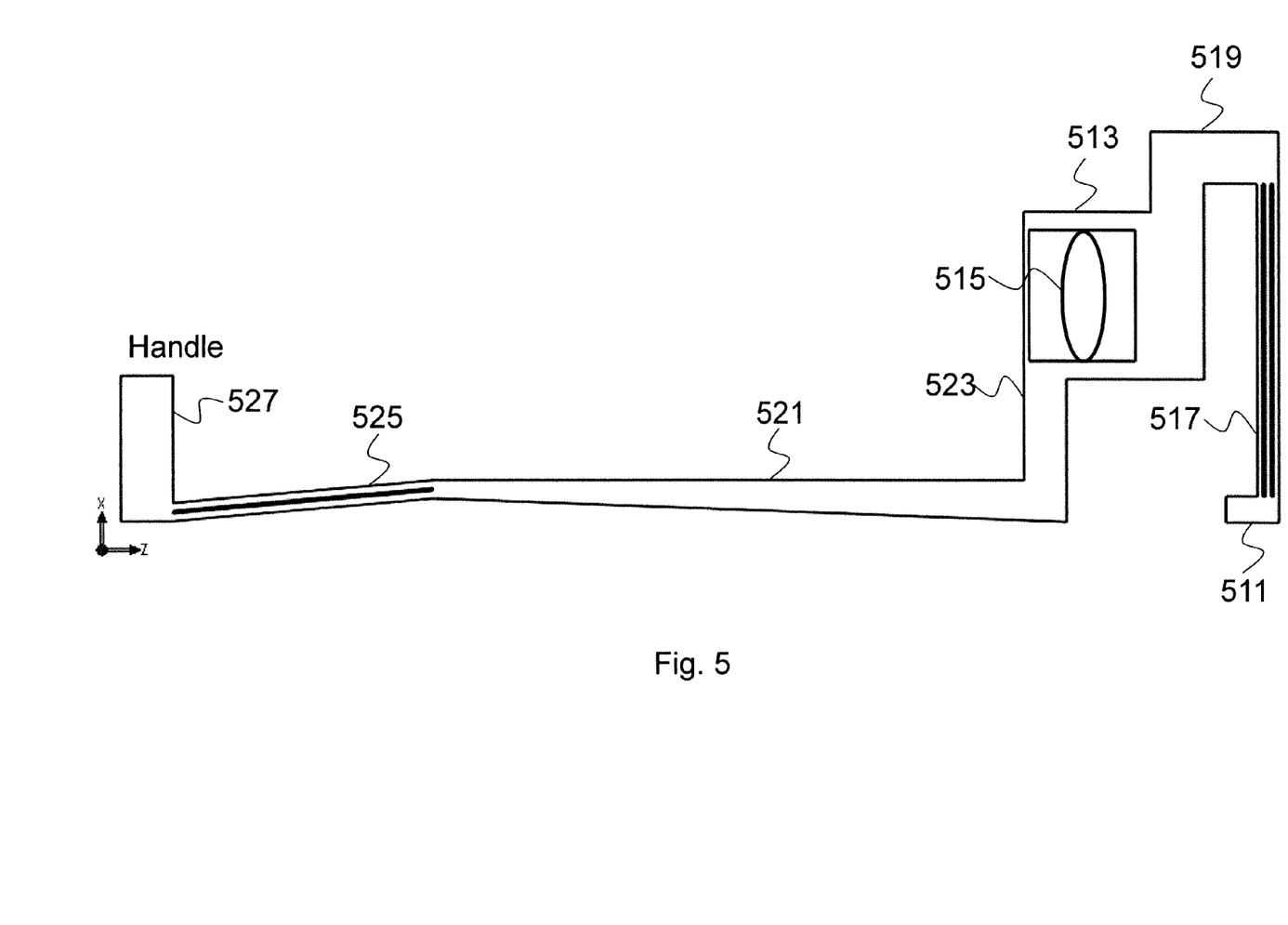
FIG. 5 illustrates a still further embodiment of a structure in accordance with aspects of the inventions.

FIG. 5 illustrates a top view of a further embodiment of a lever arm in accordance with aspects of the invention. The embodiment of FIG. 5 is particularly suited to attenuating the effects of handle rotation about the Z axis, or related effects of warping, as in the ideal device of FIG. 4. The flexures can only approximate the ideal joints, and therefore the effects of handle rotation are attenuated rather than eliminated.

As shown in FIG. 5, the lever arm is coupled to a generally immovable base 511, connected to the substrate. The base may be part of a wafer, from which the lever arm may be constructed and which may be populated with other optical components, for example as discussed with respect to FIG. 3. Generally, the lever arm includes a platform 513 for receiving a lens 515 or other optical component. The platform is coupled to a platform flexure element 517 by a first offset 519, with the platform flexure element 517 being coupled to the base. The platform is also coupled to an elongate arm 521 by a second offset 523. The elongate arm includes a lever arm flexure element 525 towards a free end of the arm, with the free end of the arm terminating in a handle 527. When locking position of the optical component, the arm may be fixed in position with respect to a wafer of which the lever arm is part (and of which the base may also be part) by solder or other fixation means. In various embodiments the solder is placed on or about the lever arm flexure element, or in various embodiments such that at least a portion or a major portion of the lever arm flexure element is between the solder and the platform.

There may be only one element in a flexure group, though the embodiment of FIG. 5 utilizes at least two flexure groups. The embodiment of FIG. 5 uses a slit to create multiple flexures and thereby add torsional compliance about Z in the handle flexure group, two slits to add torsional compliance about X in the lens platform flexure group, and the same two slits to add shear compliance along Z in the same lens platform flexure group. Such slits or the use of multiple flexures in flexure groups are useful but various embodiments may omit the slits or use of multiple flexures in flexure groups.

Figure 6:
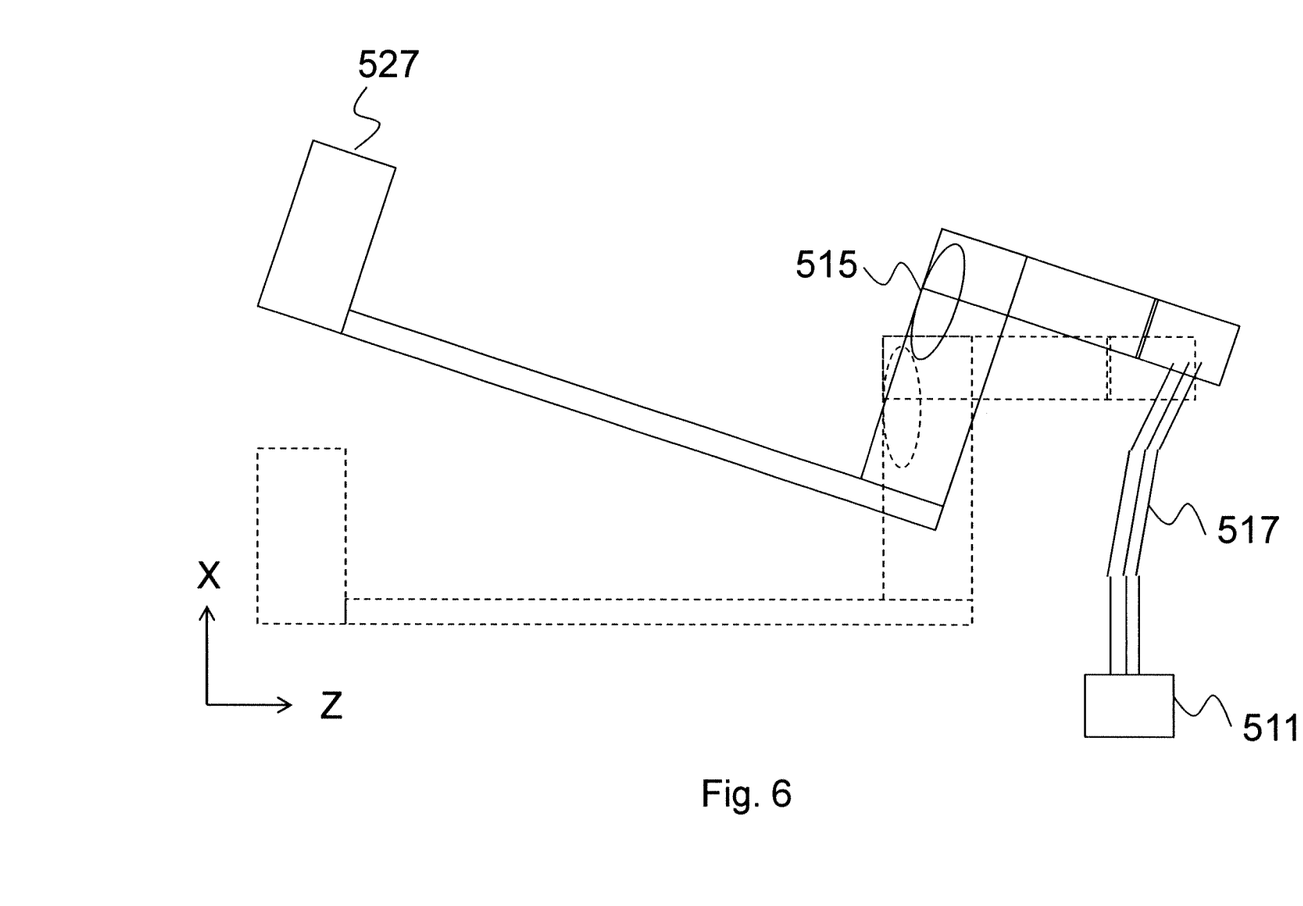
FIG. 6-8 illustrate result of movement in various directions of the embodiment of FIG. 5.
Figure 7:
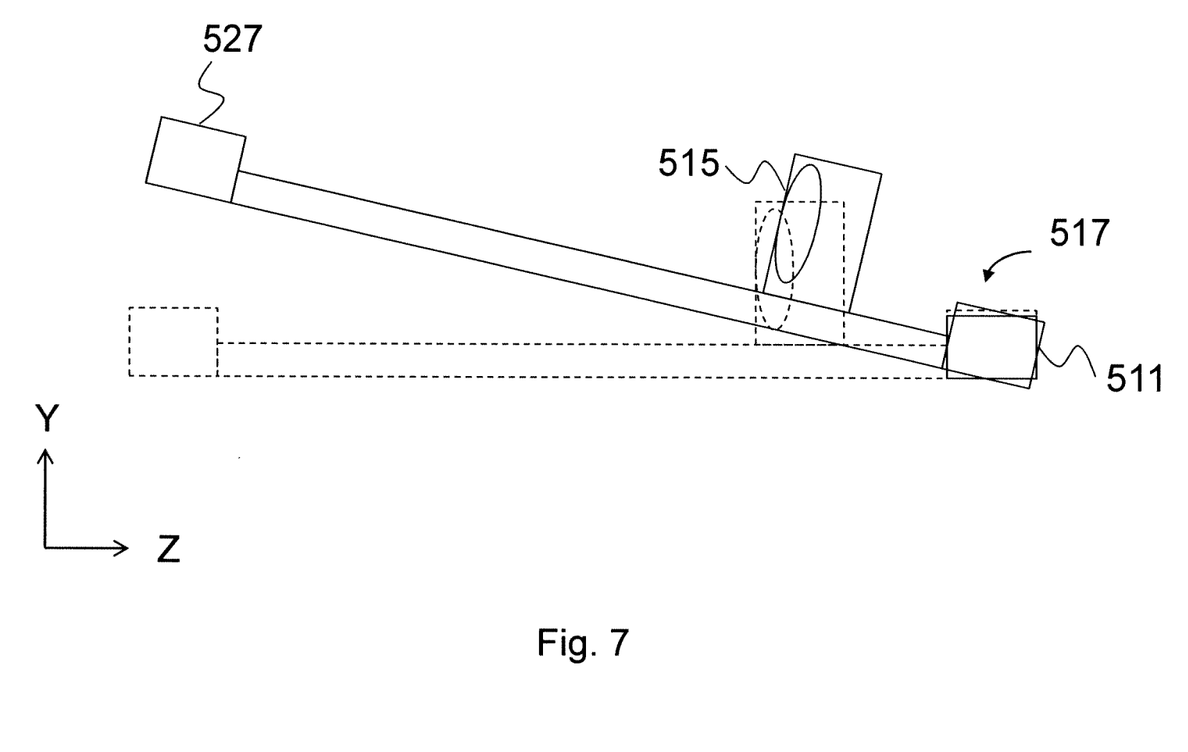
Figure 8:
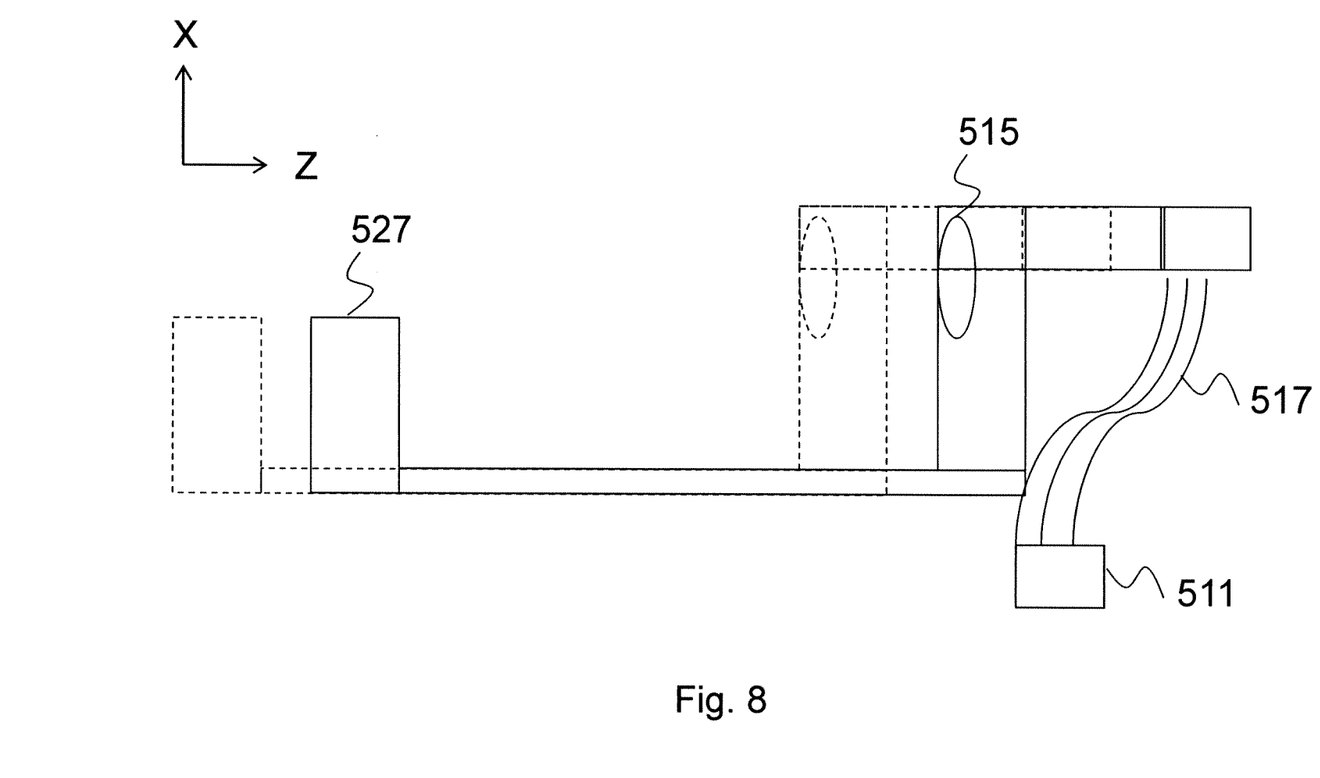

The design of the lens platform flexure group may vary, but for illustrative purposes, action of the device of FIG. 5 is described with respect to FIGS. 6-8, showing result of movement from an initial position shown in dashed outline to a new position shown in solid. For convenience, the base 511, lens 515, platform flexure element 517, and handle 527 are labeled as in FIG. 5. The lens motion along X is attained by cantilever-type degree of freedom of the flexure about the Y axis combined with an offset of the lens from the flexure in Z (this is accompanied by some rotation and Z translation) as shown in FIG. 6. The Z motion shown in FIG. 6 may be eliminated by appropriate handle motions that exploit a shear-type degree of freedom of the flexures, as discussed above. The lens motion along Y is obtained by torsion of the flexures about X combined with an offset of the lens from the flexure along Z as shown in a side view provided by FIG. 7. The lens motion along Z is obtained by shear-type bending that causes the flexures to take on a serpentine S shape as shown in FIG. 8.

Processing steps using lithographic technologies for a multipart lever may be as follows for some embodiments. The starting material that ultimately becomes an optical breadboard including the multipart lever is a raw silicon-on-insulator wafer, obtainable from numerous commercial sources. A substrate is n-type silicon, while in this example there is a one micron thick layer of silicon dioxide on top of the substrate and a 15 micron thick top p+-type silicon layer. The multipart lever will be built from this top silicon layer.

The wafer is lightly oxidized and then metalized to form high speed traces that may be used for electrical contacts for lasers or other components. The top silicon wafer is then etched, stopping at the SiO2 layers and forming the cavity around the multipart handle. The silicon underneath the oxide is then etched with a KOH solution to undercut and release the multipart lever. Note that KOH is selective and will not etch the top p+ doped layer. A final quick oxide etch cleans off any remaining oxide under the mechanical components. Finally another layer of metallization followed by deposition of solder is applied to form the solder structure and, if desired, a metallization on the lever arm. Angled evaporation may be used to allow metallization into a groove under the lever arm.

Once the optical breadboard is completed, one or more laser diodes may be soldered into the assembly, with a mechanical tolerance of about <+/−5 um. A lens for each multipart lever may then be fixed to the holders, using for example either solder or high temperature epoxy. Finally fiber pigtail, or a PLC, may be attached with rough alignment of the input waveguides.

In some embodiments setting position of the multipart lever and locking the position may be accomplished as follows. A deposition of solder may be provided about the arm near the handle. In some embodiments there may be a small metalized pad on the arm and two thick depositions of solder on either side of the arm. Application of current to the solder pads causes localized heating and the solder to melt and lock the handle in position. Once for example lasers, a PLC and lens have been loaded on to the stage, the lasers are activated, and the handle is adjusted to maximize the optical coupling to the PLC. At an acceptable optical coupling, and preferably optimum optical coupling, electrical current is applied to the solder pads, and the solder flows to a position to lock the handle in position. Optical coupling may be evaluated by determining optical output of the PLC, which may be performed for example measuring optical power using an optical power meter or other device. A substantial advantage of having the solder pad at the far end of the assembly is that any mechanical motion that might occur as the solder cools down is demagnified, and the system will see minimal reduction in output coupling. Generally the electrical current to melt the solder is removed after the solder has flowed to position to lock the handle in position, or sufficient heating has been applied to allow the solder to so flow. The solder serves, as one of skill understands, as an adhesive. In various embodiments other adhesives may be used to lock the handle in position, or laser welds or other means may be used.

There are various other ways of fixing the position of the lever after alignment has been achieved. For example, rather than electrically melting the solder to lock the arm, one may use a laser to heat the solder, which may be referred to in the art as laser soldering. One may also use epoxies that can be cured either thermally, with UV light, or a combination. Rather than having solder on both sides of the lever, one may have just one solder ball to one side, and align the part by pushing the lever into the melted solder ball. Finally, one can fix the arm in position by laser welding the silicon directly.

Accordingly, aspects of the invention relate to a MEMS based alignment technology. Although certain embodiments are described, it should be recognized that various aspects of the invention include the novel and non-obvious claims supported by this disclosure.

The invention claimed is:

1. A mechanism for positioning an optical component, comprising:
   a first flexure coupling a structure to a base;
   the structure generally in the form of a quadrilateral, the structure including a first pair of flexures having a first direction of orientation, a second pair of flexures having a second direction of orientation, a first member coupling first ends of the first pair of flexures, a second member coupling first ends of the second pair of flexures, and a mount for an optical component; and
   an elongate arm extending generally from the structure.

2. The mechanism of claim 1 wherein the structure generally in the form of a quadrilateral is a structure generally in the form of a parallelogram.

3. The mechanism of claim 1 wherein the mount for the optical component is on the first member.

4. The mechanism of claim 1 wherein the first direction is substantially orthogonal to the second direction.

5. The mechanism of claim 4 wherein each flexure of the pairs of flexures constrains relative motion of its ends in a third direction, the third direction being substantially orthogonal to the first direction and the second direction.

6. The mechanism of claim 5 wherein each flexure of the first pair of flexures constrains relative motion of its ends in the first direction and each flexure of the second pair of flexures constrains relative motion of its ends in the second direction.

7. The mechanism of claim 1 wherein the first flexure is coupled to the second member.

8. The mechanism of claim 1 wherein the mount for the optical component is coupled to the first member.

9. The mechanism of claim 1 wherein the elongate arm is connected to an end of one of the flexures of the first pair of flexures and to an end of one of the flexures of the second pair of flexures.

* * * * *